United States Patent
Tian et al.

(10) Patent No.: US 12,282,070 B2
(45) Date of Patent: Apr. 22, 2025

(54) INSULATION MONITORING METHOD AND SYSTEM FOR TRACTION BATTERY AND APPARATUS

(71) Applicant: NIO CO., LTD., Shanghai (CN)

(72) Inventors: Weichao Tian, Shanghai (CN); Lei Ye, Shanghai (CN); Zerun Zhou, Shanghai (CN)

(73) Assignee: NIO CO., LTD., Shanghai (CN)

( * ) Notice: Subject to any disclaimer, the term of this patent is extended or adjusted under 35 U.S.C. 154(b) by 319 days.

(21) Appl. No.: 17/801,761

(22) PCT Filed: Dec. 11, 2020

(86) PCT No.: PCT/CN2020/135577
§ 371 (c)(1),
(2) Date: Aug. 23, 2022

(87) PCT Pub. No.: WO2021/169489
PCT Pub. Date: Sep. 2, 2021

(65) Prior Publication Data
US 2023/0109419 A1 Apr. 6, 2023

(30) Foreign Application Priority Data

Feb. 24, 2020 (CN) .......................... 202010113762.8

(51) Int. Cl.
*G01R 31/392* (2019.01)
*G01R 31/36* (2020.01)
*G01R 31/389* (2019.01)

(52) U.S. Cl.
CPC ....... *G01R 31/392* (2019.01); *G01R 31/3648* (2013.01); *G01R 31/389* (2019.01)

(58) Field of Classification Search
CPC ...... G01R 31/006; G01R 31/36; G01R 31/52; G01R 31/389; G01R 31/392;
(Continued)

(56) References Cited

U.S. PATENT DOCUMENTS

| 2009/0323233 A1* | 12/2009 | Shoemaker .......... G01R 27/025 361/42 |
| 2013/0300430 A1* | 11/2013 | Lindsay .................. B60L 58/21 324/522 |
| 2017/0113553 A1* | 4/2017 | Gale ...................... G01R 31/52 |

FOREIGN PATENT DOCUMENTS

| CN | 105277787 | 1/2016 |
| CN | 105738701 | 7/2016 |

(Continued)

OTHER PUBLICATIONS

International Search Report and Written Opinion for International (PCT) Patent Application No. PCT/CN2020/135577, dated Mar. 16, 2021, 9 pages.
(Continued)

*Primary Examiner* — John H Le
(74) *Attorney, Agent, or Firm* — Sheridan Ross P.C.

(57) ABSTRACT

An insulation monitoring method and system for a traction battery and an apparatus are proposed to solve the problem of how to accurately predict a risk of insulation deterioration of the traction battery before the insulation deterioration occurs on the traction battery, so as to provide an early warning about failures in the traction battery. In this method, data statistics on a large amount of insulation resistance values within a long period of time are collected, and whether the traction battery has the risk of insulation deterioration is determined by analysis based on a data statistical result; and if the traction battery has the risk of insulation deterioration, alarm information is output. In this method, based on data statistical analysis performed on the large amount of insulation resistance values within a long period of time, insulation deterioration can be predicted before the insulation deterioration occurs on the traction battery. This allows a user to perform battery maintenance in time before
(Continued)

the insulation deterioration occurs on the traction battery, so as to prevent traction battery failures.

13 Claims, 4 Drawing Sheets

(58) Field of Classification Search
CPC ....... G01R 27/025; B60L 58/10; B60L 58/16; B60L 3/0046; B60L 3/0069; B60L 2240/80; B60L 2250/10
USPC ........................................................ 702/63
See application file for complete search history.

(56) References Cited

FOREIGN PATENT DOCUMENTS

| | | |
|---|---|---|
| CN | 106324462 | 1/2017 |
| CN | 207601183 | 7/2018 |
| CN | 108427033 | 8/2018 |
| CN | 111308376 | 6/2020 |
| JP | 5052414 | 10/2012 |
| JP | 6057127 | 1/2017 |

OTHER PUBLICATIONS

English Translation of the International Search Report for International (PCT) Patent Application No. PCT/CN2020/135577, dated Mar. 16, 2021, 3 pages.

* cited by examiner

INSULATION MONITORING METHOD AND SYSTEM FOR TRACTION BATTERY AND APPARATUS

CROSS REFERENCE TO RELATED APPLICATIONS

This application is a national stage application under 35 U.S.C. 371 and claims the benefit of PCT Application No. PCT/CN2020/135577 having an international filing date of 11 Dec. 2020, which designated the United States, which PCT application claimed the benefit of China Patent Application No. 202010113762.8 filed 24 Feb. 2020, the disclosures of each of which are incorporated herein by reference in their entireties.

TECHNICAL FIELD

The disclosure relates to the field of battery insulation monitoring technologies, and in particular, to an insulation monitoring method and system for a traction battery and an apparatus.

BACKGROUND ART

A traction battery in a high-voltage system of an electric vehicle needs to have good electrical insulation performance to ensure safety of the traction battery and passengers in the electric vehicle. For example, when insulation deterioration occurs on the traction battery, a cell inside the traction battery may be short-circuited, and a temperature of the short-circuited cell may be increased due to an excessive short-circuit current. If the temperature of the short-circuited cell is too high, other surrounding cells may also be short-circuited with an increasing temperature, resulting in an increasing temperature of the entire traction battery, which increases a risk of thermal runaway of the traction battery.

An early warning about battery failures such as thermal runaway may be provided by monitoring the insulation performance of the traction battery, which may prompt a user to repair the traction battery to prevent the battery failures. However, in a traditional insulation performance monitoring method for a traction battery, insulation deterioration of the traction battery can be detected and an alarm can be given only when the traction battery is actually in a state of insulation deterioration. In this case, battery failures such as thermal runaway probably have occurred on the traction battery due to insulation deterioration. As a result, this method cannot provide a reliable and effective warning about failures in the traction battery.

Accordingly, there is a need for a new insulation monitoring solution for a traction battery in this field to solve the foregoing problems.

SUMMARY OF THE DISCLOSURE

In order to overcome the foregoing defects, the disclosure proposes an insulation monitoring method and system for a traction battery and an apparatus, to solve or at least partially solve the problem of how to accurately predict a risk of insulation deterioration of the traction battery before the insulation deterioration occurs on the traction battery, so as to provide an early warning about failures in the traction battery.

According to a first aspect, an insulation monitoring method for a traction battery is provided, where the method includes: obtaining, by taking a current moment as a starting time, each insulation resistance value of the traction battery that is received within a first preset time period before the current moment; collecting data statistics on the obtained insulation resistance values, and analyzing, based on a data statistical result, whether the traction battery has a risk of insulation deterioration; and if the traction battery has the risk of insulation deterioration, outputting first alarm information.

The step of "collecting data statistics on the obtained insulation resistance values, and analyzing, based on a data statistical result, whether the traction battery has a risk of insulation deterioration" specifically includes: separately performing mean and variance calculations on the insulation resistance values received within the first preset time period, to obtain a mean insulation resistance value res_avg and an insulation resistance value variance res_std; arranging, in ascending order, the insulation resistance values received within the first preset time period, and calculating a cumulative percentage corresponding to each arranged insulation resistance value; obtaining an insulation resistance value res_Npct corresponding to a cumulative percentage whose percentage value is a preset value N; and analyzing, based on res_avg, res_std, and res_Npct, whether the traction battery has the risk of insulation deterioration, specifically including the following case: if $$\begin{cases} \text{res\_avg} < \text{res\_avg\_set} \\ \text{res\_Npct} < \text{res\_avg\_set}, \\ \text{res\_std} < \text{res\_std\_set} \end{cases}$$

the traction battery is in a state of low insulation resistance value, where res_avg_set is a preset value for the mean insulation resistance value, and res_std_set is a preset value for the insulation resistance value variance.

Before the step of "collecting data statistics on the obtained insulation resistance values", the method further includes: step S1: determining whether a quantity of the obtained insulation resistance values reaches a preset quantity threshold; and if the quantity of the obtained insulation resistance values reaches the preset quantity threshold, performing the step of "collecting data statistics on the obtained insulation resistance values"; or if the quantity of the obtained insulation resistance values does not reach the preset quantity threshold, performing step S2; and step S2: extending the current first preset time period based on a preset extension time, re-obtaining, by taking the current moment as the starting time, insulation resistance values received within the extended first preset time period before the current moment, and then performing step S1.

After determining, by analysis, that the traction battery has the risk of insulation deterioration, the method further includes: obtaining, by taking the current moment as the starting time, each insulation resistance value of the traction battery that is received within a second preset time period before the current moment, and arranging the insulation resistance values in chronological order of reception to obtain an insulation resistance value array; performing a regression fitting calculation on the insulation resistance values in the insulation resistance value array, to obtain an insulation resistance fitting value corresponding to each insulation resistance value in the insulation resistance value array, and arranging, in the chronological order of reception, the insulation resistance fitting values respectively corresponding to all the insulation resistance values, to obtain an insulation resistance fitting value array; performing a first-order difference calculation on the insulation resistance fitting values in the insulation resistance fitting value array to obtain a first-order difference corresponding to each insulation resistance fitting value; and comparing each first-order difference with a preset difference threshold, analyzing a risk level of insulation deterioration of the traction battery based on a comparison result, and outputting corresponding second alarm information, where the second preset time period is much greater than the first preset time period, and a quantity of the insulation resistance values received within the second preset time period is much greater than a quantity of the insulation resistance values received within the first preset time period.

The step of "comparing each first-order difference with a preset difference threshold, and analyzing a risk level of insulation deterioration of the traction battery based on a comparison result" specifically includes: counting a first quantity count_down of first-order differences whose difference values are less than a preset lower difference value limit and a second quantity count_up of first-order differences whose difference values are greater than a preset upper difference value limit, where if count_down<2 and count_up=0, the risk level of insulation deterioration of the traction battery is a high risk level; if count_down>2 and count_up=0, the risk level of insulation deterioration of the traction battery is a medium risk level; and if count_down=2 and count_up=0 and resA_std=0, the risk level of insulation deterioration of the traction battery is a low risk level, where resA_std is an insulation resistance fitting value variance obtained by performing a variance calculation on the insulation resistance fitting values corresponding to all the insulation resistance values received within the second preset time period.

The method further includes: when the risk level of insulation deterioration of the traction battery is the low risk level, outputting prompt information about a detection failure of the insulation resistance value of the traction battery.

According to a second aspect, an insulation monitoring system for a traction battery is provided, where the system includes: a data obtaining apparatus configured to obtain, by taking a current moment as a starting time, each insulation resistance value of the traction battery that is received within a first preset time period before the current moment; and a data analysis apparatus configured to: collect data statistics on the insulation resistance values obtained by the data obtaining apparatus, and analyze, based on a data statistical result, whether the traction battery has a risk of insulation deterioration; and if the traction battery has the risk of insulation deterioration, output first alarm information.

The data analysis apparatus includes a mean/variance calculation module, a percentile calculation module, and a data analysis module; the mean/variance calculation module is configured to separately perform mean and variance calculations on the insulation resistance values received within the first preset time period, to obtain a mean insulation resistance value res_avg and an insulation resistance value variance res_std; the percentile calculation module is configured to: arrange, in ascending order, the insulation resistance values received within the first preset time period, and calculate a cumulative percentage corresponding to each arranged insulation resistance value; and obtain an insulation resistance value res_Npct corresponding to a cumulative percentage whose percentage value is a preset value N; and the data analysis module is configured to analyze, based on res_avg, res_std, and res_Npct, whether the traction battery has the risk of insulation deterioration, specifically including the following case: if $$\begin{cases} \text{res\_avg} < \text{res\_avg\_set} \\ \text{res\_Npct} < \text{res\_avg\_set}, \\ \text{res\_std} < \text{res\_std\_set} \end{cases}$$

the traction battery is in a state of low insulation resistance value, where res_avg_set is a preset value for the mean insulation resistance value, and res_std_set is a preset value for the insulation resistance value variance.

The data analysis apparatus is further configured to perform the following operations: step S1: determining whether a quantity of the obtained insulation resistance values reaches a preset quantity threshold; and if the quantity of the obtained insulation resistance values reaches the preset quantity threshold, performing the step of "collecting data statistics on the obtained insulation resistance values"; or if the quantity of the obtained insulation resistance values does not reach the preset quantity threshold, performing step S2; and step S2: extending the current first preset time period based on a preset extension time, re-obtaining, by taking the current moment as the starting time, insulation resistance values received within an extended first preset time period before the current moment, and then performing step S1.

The system further includes a battery insulation deterioration risk analysis apparatus, and the battery insulation deterioration risk level analysis apparatus includes a data obtaining module, a regression fitting calculation module, a first-order difference calculation module, and an insulation deterioration risk level analysis module; the data obtaining module is configured to obtain, by taking the current moment as the starting time, each insulation resistance value received within a second preset time period before the current moment, and arrange the insulation resistance values in chronological order of reception to obtain an insulation resistance value array; the regression fitting calculation module is configured to: perform a regression fitting calculation on the insulation resistance values in the insulation resistance value array, to obtain an insulation resistance fitting value corresponding to each insulation resistance value in the insulation resistance value array, and arrange, in the chronological order of reception, the insulation resistance fitting values respectively corresponding to all the insulation resistance values, to obtain an insulation resistance fitting value array; the first-order difference calculation module is configured to perform a first-order difference calculation on the insulation resistance fitting values in the insulation resistance fitting value array to obtain a first-order difference corresponding to each insulation resistance fitting value; and the insulation deterioration risk level analysis module is configured to: compare each first-order difference with a preset difference threshold, analyze a risk level of insulation deterioration of the traction battery based on a comparison result, and output corresponding second alarm information, where the second preset time period is much greater than the first preset time period, and a quantity of the insulation resistance values received within the second preset time period is much greater than a quantity of the insulation resistance values received within the first preset time period.

The insulation deterioration risk level analysis module is further configured to perform the following operations: counting a first quantity count_down of first-order differences whose difference values are less than a preset lower difference value limit and a second quantity count_up of first-order differences whose difference values are greater than a preset upper difference value limit, where if count_down<2 and count_up=0, the risk level of insulation deterioration of the traction battery is a high risk level; if count_down>2 and count_up=0, the risk level of insulation deterioration of the traction battery is a medium risk level; and if count_down=2 and count_up=0 and resA_std=0, the risk level of insulation deterioration of the traction battery is a low risk level, where resA_std is an insulation resistance fitting value variance obtained by performing a variance calculation on the insulation resistance fitting values corresponding to all the insulation resistance values received within the second preset time period.

The insulation deterioration risk level analysis module is further configured to perform the following operations: when the risk level of insulation deterioration of the traction battery is the low risk level, outputting prompt information about a detection failure of the insulation resistance value of the traction battery.

According to a third aspect, a storage apparatus storing a plurality of pieces of program codes is provided, where the program codes are adapted to be loaded and run by a processor to perform the insulation monitoring method for a traction battery described in any one of the above.

According to a fourth aspect, a control apparatus including a processor and a storage apparatus is provided, where the storage apparatus is adapted to store a plurality of pieces of program codes, and the program codes are adapted to be loaded and run by the processor to perform the insulation monitoring method for a traction battery described in any one of the above.

The foregoing one or more technical solutions of the disclosure have at least one or more of the following beneficial effects:

In the technical solutions for implementing the disclosure, insulation resistance values received within a relatively long period of time (such as 10 hours) are extracted, data statistics on these insulation resistance values are collected, and whether the traction battery has the risk of insulation deterioration is determined by analysis based on a data statistical result; and if the traction battery has the risk of insulation deterioration, alarm information is output. As an example, a battery management system of an electric vehicle detects an insulation resistance value of a traction battery in real time, and sends detected insulation resistance values to a backend server connected to the electric vehicle via a network. The backend server receives and stores the insulation resistance value corresponding to each traction battery. After determining, by performing the foregoing operations, that the traction battery has the risk of insulation deterioration, the backend server outputs the alarm information to the electric vehicle to prompt a user of the electric vehicle that the traction battery has the risk of insulation deterioration. In the embodiments of the disclosure, data statistics on a large amount of insulation resistance values within a long period of time are collected, and whether the traction battery has the risk of insulation deterioration is determined by analysis based on the data statistical result. Therefore, insulation deterioration can be predicted before the insulation deterioration occurs on the traction battery. This allows the user to perform battery maintenance in time before the insulation deterioration occurs on the traction battery, so as to prevent traction battery failures.

Further, in the technical solutions for implementing the disclosure, when it is determined that the traction battery has the risk of insulation deterioration, the following steps may be performed to further determine, by analysis, a risk level of insulation deterioration of the traction battery. Specifically: First, extract insulation resistance received within a period of time (such as 50 hours) longer than the foregoing relatively long period of time, and perform a regression fitting calculation on these insulation resistance values, to obtain an insulation resistance fitting value corresponding to each insulation resistance value. Then, perform a first-order difference calculation on these insulation resistance fitting values to obtain a first-order difference corresponding to each insulation resistance fitting value, compare each first-order difference with a preset difference threshold, find, based on a comparison result, an insulation resistance value of the traction battery that is obtained in a case of a sudden change (sudden drop) of the insulation resistance of the traction battery, then evaluate a risk level (a high risk level, a medium risk level, and a low risk level) of insulation deterioration of the traction battery based on a quantity of insulation resistance values obtained in the case of the sudden change of the insulation resistance, and output corresponding second alarm information. In the embodiments of the disclosure, the regression fitting calculation is performed on a large amount of insulation resistance values obtained within a long period of time, and a regression fitting calculation result may be used to represent a change trend of the insulation resistance; and the risk level of insulation deterioration of the traction battery may be accurately evaluated by performing a first-order difference calculation on the regression fitting calculation result and comparing each first-order difference with the preset difference threshold.

BRIEF DESCRIPTION OF THE DRAWINGS

Specific implementations of the disclosure are described below with reference to the accompanying drawings, in which.

LIST OF REFERENCE NUMERALS

Figure 1:
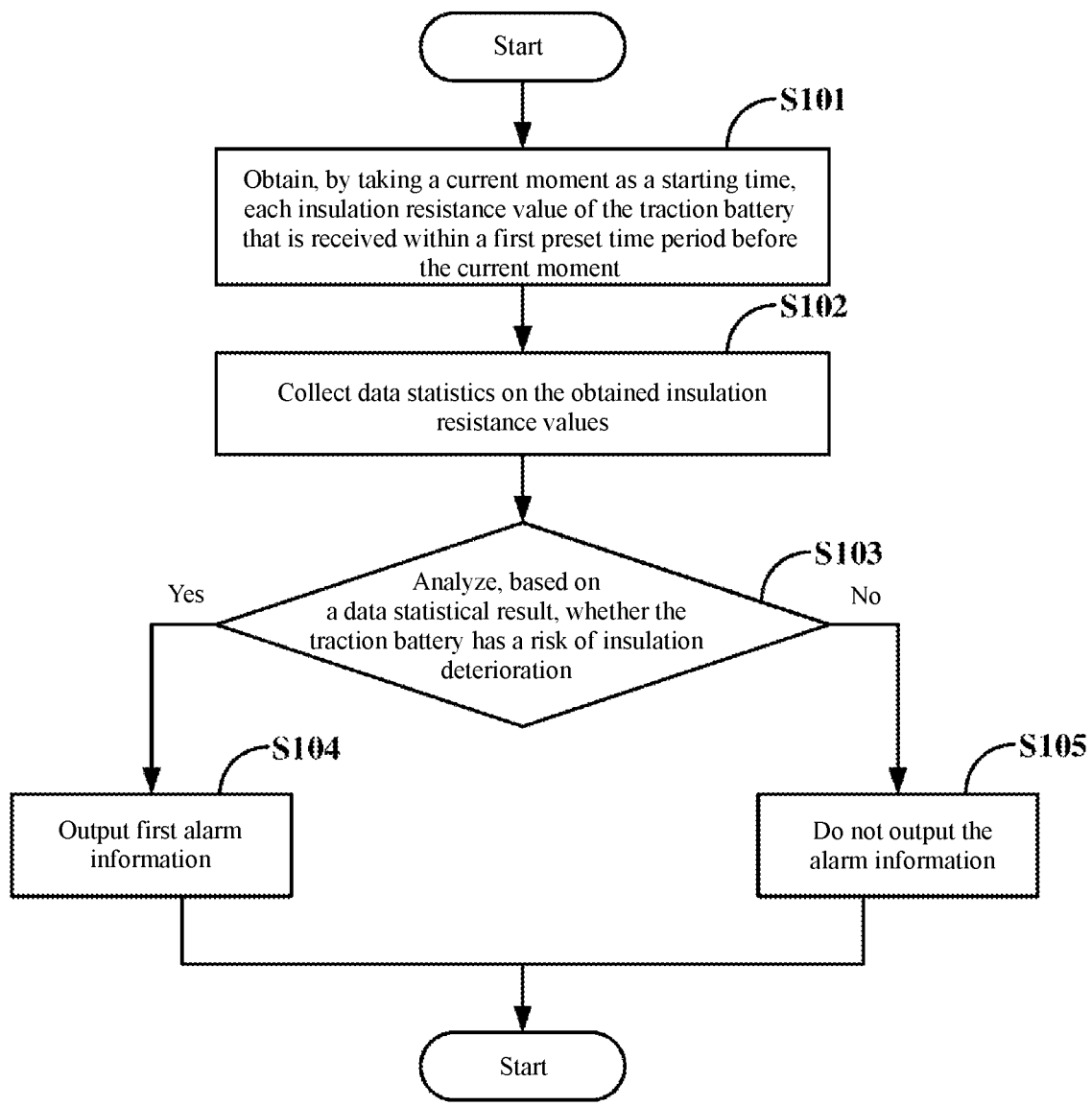
FIG. 1 is a schematic flowchart of main steps of an insulation monitoring method for a traction battery according to an embodiment of the disclosure.

11: Data obtaining apparatus; 12: Data analysis apparatus; 21: Electric vehicle; 22: Backend server.

DETAILED DESCRIPTION OF EMBODIMENTS

Some implementations of the disclosure are described below with reference to the accompanying drawings. Those skilled in the art should understand that these implementations are only used to explain the technical principles of the disclosure, and are not intended to limit the protection scope of the disclosure.

In the description of the disclosure, a "module" or "processor" may include hardware, software, or a combination thereof. A module may include a hardware circuit, various suitable sensors, a communication port, and a memory, or may include a software part, such as program code, or may be a combination of software and hardware. The processor may be a central processing unit, a microprocessor, a digital signal processor, or any other suitable processor. The processor has a data and/or signal processing function. The processor may be implemented in software, hardware, or a combination thereof. A non-transitory computer-readable storage medium includes any suitable medium that can store program code, such as a magnetic disk, a hard disk, an optical disc, a flash memory, a read-only memory, or a random access memory. The term "A and/or B" indicates all possible combinations of A and B, for example, only A, only B, or A and B. The term "at least one of A or B" or "at least one of A and B" has a meaning similar to "A and/or B" and may include only A, only B, or A and B. The terms "a/an" and "this" in the singular form may also include the plural form.

Some terms involved in the disclosure are explained herein first.

The insulation resistance of the traction battery refers to the resistance that can limit a leakage voltage of the traction battery to a small range, and is one of the important indexes of the insulation performance of the traction battery.

The insulation deterioration of the traction battery refers to an irreversible decline of the insulation performance of the traction battery. For example, there is an irreversible drop in the insulation resistance of the traction battery.

Failures of the traction battery mainly include a performance failure and a safety failure of the traction battery. The performance failure refers to that the capacity and service life of the traction battery cannot meet preset use requirements, and the safety failure refers to that the traction battery has some safety risks due to improper use and other factors. For example, when thermal runaway occurs on the traction battery, the traction battery has a safety risk, and the traction battery has a safety failure.

In a traditional insulation performance monitoring method for a traction battery in the prior art, the insulation deterioration of the traction battery can be detected and an alarm can be given when the traction battery is actually in a state of insulation deterioration. In this case, battery failures such as thermal runaway probably have occurred on the traction battery due to insulation deterioration. As a result, this method cannot provide a reliable and effective warning about failures in the traction battery.

In the embodiments of the disclosure, insulation resistance values received within a relatively long period of time (such as 10 hours) are extracted, data statistics on these insulation resistance values are collected, and whether the traction battery has the risk of insulation deterioration is determined by analysis based on a data statistical result; and if the traction battery has the risk of insulation deterioration, alarm information is output. As an example, a battery management system of an electric vehicle detects an insulation resistance value of a traction battery in real time, and sends detected insulation resistance values to a backend server connected to the electric vehicle via a network. The backend server receives and stores the insulation resistance value corresponding to each traction battery. After determining, by performing the foregoing operations, that the traction battery has the risk of insulation deterioration, the backend server outputs the alarm information to the electric vehicle to prompt a user of the electric vehicle that the traction battery has the risk of insulation deterioration. In the embodiments of the disclosure, data statistics on a large amount of insulation resistance values within a long period of time are collected, and whether the traction battery has the risk of insulation deterioration is determined by analysis based on the data statistical result. Therefore, insulation deterioration can be predicted before the insulation deterioration occurs on the traction battery. This allows the user to perform battery maintenance in time before the insulation deterioration occurs on the traction battery, so as to prevent traction battery failures.

Further, in the embodiments of the disclosure, when it is determined that the traction battery has the risk of insulation deterioration, the following steps may be performed to further determine, by analysis, the risk level of insulation deterioration of the traction battery. Specifically: First, extract insulation resistance received within a period of time (such as 50 hours) longer than the foregoing relatively long period of time, and perform a regression fitting calculation on these insulation resistance values, to obtain an insulation resistance fitting value corresponding to each insulation resistance value. Then, perform a first-order difference calculation on these insulation resistance fitting values to obtain a first-order difference corresponding to each insulation resistance fitting value, compare each first-order difference with a preset difference threshold, find, based on a comparison result, an insulation resistance value of the traction battery that is obtained in a case of a sudden change (sudden drop) of the insulation resistance of the traction battery, then evaluate a risk level (a high risk level, a medium risk level, and a low risk level) of insulation deterioration of the traction battery based on a quantity of insulation resistance values obtained in the case of the sudden change of the insulation resistance, and output corresponding second alarm information. In the embodiments of the disclosure, the regression fitting calculation is performed on a large amount of insulation resistance values obtained within a long period of time, and a regression fitting calculation result may be used to represent a change trend of the insulation resistance; and the risk level of insulation deterioration of the traction battery may be accurately evaluated by performing a first-order difference calculation on the regression fitting calculation result and comparing each first-order difference with the preset difference threshold.

Figure 7:
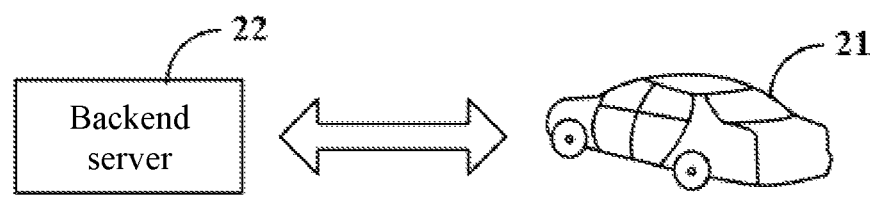
FIG. 7 is a schematic diagram of an application scenario of the disclosure.

Referring to FIG. 7, FIG. 7 is a schematic diagram of an application scenario of an embodiment involved in the technical solutions of the disclosure. The electric vehicle 21 is provided with a communication apparatus, a traction battery, and a battery management system (Battery Management System, BMS) capable of detecting the insulation resistance value of the traction battery. The electric vehicle 21 establishes a communication connection with a backend server 22 through the communication apparatus (including but not limited to: a WIFI communication apparatus and a 4G communication apparatus (a communication apparatus based on the 4th Generation Mobile Communication and technologies thereof)). The battery management system detects an insulation resistance value of the traction battery in real time, and the electric vehicle 21 sends detected insulation resistance values to the backend server 22 in real time through the communication apparatus. The backend server 22 performs data analysis on the received insulation resistance values, and after determining, by analysis, that the traction battery has the risk of insulation deterioration and determining a corresponding risk level, the backend server 22 may send alarm information (for example, the current traction battery has a high risk of insulation deterioration) to the electric vehicle 21, so as to prompt the driver in the electric vehicle 21 to repair the traction battery in time. Further, the backend server 22 may also establish a communication connection with a terminal (including but not limited to: a mobile phone and a tablet computer) of the user of the electric vehicle 21 and/or a terminal (including but not limited to: a computer device) of a service provider of the electric vehicle. After determining, by analysis, that the traction battery has the risk of insulation deterioration and determining a corresponding risk level, the backend server 22 sends alarm information to the terminal of the user and/or sends, based on an identification code of the current traction battery (including but not limited to: an ID number of the traction battery), alarm information (for example, the traction battery with the ID number of "Battery111" has a high risk of insulation deterioration) to the terminal of the service provider of the electric vehicle, to prompt the service provider of the electric vehicle to repair the traction battery in time.

Referring to FIG. 1, FIG. 1 is a schematic flowchart of main steps of an insulation monitoring method for a traction battery according to an embodiment of the disclosure. As shown in FIG. 1, the insulation monitoring method for a traction battery according to this embodiment of the disclosure mainly includes the following steps.

Step S101: Obtain, by taking a current moment as a starting time, each insulation resistance value of the traction battery that is received within a first preset time period before the current moment.

The current moment refers to a current moment of performing insulation monitoring on the traction battery rather than a current moment of receiving the insulation resistance value.

As an example, the current moment is 8:00 pm on Jan. 1, 2020, and the first preset time period is 2 hours. Therefore, "each insulation resistance value of the traction battery that is received within a first preset time period before the current moment" refers to each insulation resistance value of the traction battery that is received within 2 hours between 6:00 pm and 8:00 pm.

In an implementation, an insulation resistance value of the traction battery that is detected and sent by an insulation resistance detection apparatus such as a battery management system may be directly received, and an insulation resistance value of the traction battery that is sent by other apparatuses connected to the insulation resistance detection apparatus via a network may also be received. These apparatuses can receive/store the insulation resistance values of the traction battery that are detected by the insulation resistance detection apparatus. As an example, the insulation resistance values of the traction battery that are sent by the battery management system in the electric vehicle are directly received; and as another example, the insulation resistance values of the traction battery that are sent by an onboard control apparatus of the electric vehicle are received, where the onboard control apparatus is connected to the battery management system via a network and can receive/store the insulation resistance values of the traction battery that are detected by the battery management system.

In an implementation, after the insulation resistance values received within the first preset time period before the current moment are obtained, there may be a step of determining a quantity of the received insulation resistance values and determining, based on a determining result, whether to re-obtain insulation resistance values. This step specifically includes:

Step S1021: Determine, after obtaining the insulation resistance values received within the first preset time period before the current moment, whether a quantity of the obtained insulation resistance values reaches a preset quantity threshold; and if the quantity of the obtained insulation resistance values reaches the preset quantity threshold, there is no need to re-obtain insulation resistance values, and perform step S103; or if the quantity of the obtained insulation resistance values reaches the preset quantity threshold, there is a need to re-obtain insulation resistance values, and perform step S1022.

Step S1022: Extend the current first preset time period based on a preset extension time, re-obtain, by taking the current moment as the starting time, insulation resistance values received within an extended first preset time period before the current moment, and then perform step S1021.

As an example, assuming that the current moment is 8:00 pm on Jan. 1, 2020, the first preset time period is 2 hours, the preset extension time is 1 hour, and the preset quantity threshold is 30, a step of determining whether to re-obtain insulation resistance values specifically includes:

Step 1: After obtaining each insulation resistance value received within 2 hours between 6:00 pm and 8:00 pm, determine that the quantity of the insulation resistance values received during this time period is less than 30, then delay the first preset time period by 1 hour, and re-obtain each insulation resistance value received within 2 hours between 5:00 pm and 8:00 pm.

Step 2: After obtaining each insulation resistance value received within 3 hours between 5:00 pm and 8:00 pm, determine that the quantity of insulation resistance values received during this time period is still less than 30, then delay the first preset time period by 1 hour again, and re-obtain each insulation resistance value received within 4 hours between 4:00 pm and 8:00 pm.

Step 3: After obtaining each insulation resistance value received within 4 hours between 4:00 pm and 8:00 pm, determine that the quantity of insulation resistance values received during this time period is greater than 30, and therefore there is no need to re-obtain insulation resistance values.

In the embodiments of the disclosure, data statistics on a large amount of insulation resistance values within a long period of time are collected, and whether the traction battery has the risk of insulation deterioration may be accurately determined by analysis based on a data statistical result. However, in practical application, due to different insulation resistance detection frequencies or insulation resistance transmitting frequencies of different insulation resistance detection apparatuses or other reasons, there is a great difference in quantities of insulation resistance values received within a same first preset time period by a traction battery using different insulation resistance detection apparatuses. If the quantity of the received insulation resistance values is too small, the accuracy of the data statistical analysis result is seriously affected, thereby further affecting the accuracy of risk analysis of insulation deterioration. Therefore, in order to overcome this problem, in this embodiment of the disclosure, after the insulation resistance values are received within the first preset time period, it is also necessary to determine whether the quantity of obtained insulation resistance values is sufficient (whether the quantity of the insulation resistance values is greater than or equal to the preset quantity threshold), and whether high accuracy of the insulation deterioration analysis of the traction battery can be ensured; and if the quantity of the obtained insulation resistance values is small (the quantity of the insulation resistance values is less than the preset quantity threshold), the first preset time period is extended and insulation resistance values are re-obtained until the quantity of the insulation resistance values is large enough to ensure the high accuracy of the insulation deterioration analysis of the traction battery.

Step S102: Collect data statistics on the obtained insulation resistance values.

In an implementation, the mean value, the variance, and the percentile of the insulation resistance values during this time period may be obtained by collecting data statistics on n insulation resistance values {res1, res2, ..., resi, ..., resn} obtained within the first preset time period before the current moment.

1. Mean Value

The mean value res_avg of the insulation resistance values is calculated according to the method shown in the following formula (1):

$$\text{res\_avg} = \frac{\sum_{i}^{n} resi}{n} \quad (1)$$

resi in the formula (1) represents the $i^{th}$ insulation resistance value received within the first preset time period before the current moment.

2. Variance

The variance res_std of the insulation resistance values is calculated according to the method shown in the following formula (2):

$$\text{res\_std} = \frac{\sum_{i}^{n} (res_i - \text{res\_avg})^2}{n-1} \quad (2)$$

3. Percentile

In this implementation, the percentile of the insulation resistance values may be obtained according to the following steps: First, arrange, in ascending order, the insulation resistance values received within the first preset time period before the current moment, and calculate a cumulative percentage corresponding to each arranged insulation resistance value; and then obtain an insulation resistance value res_Npct corresponding to a cumulative percentage whose percentage value is a preset value N. As an example, an insulation resistance value res_90pct corresponding to a cumulative percentage of 90% is obtained.

Figure 2:
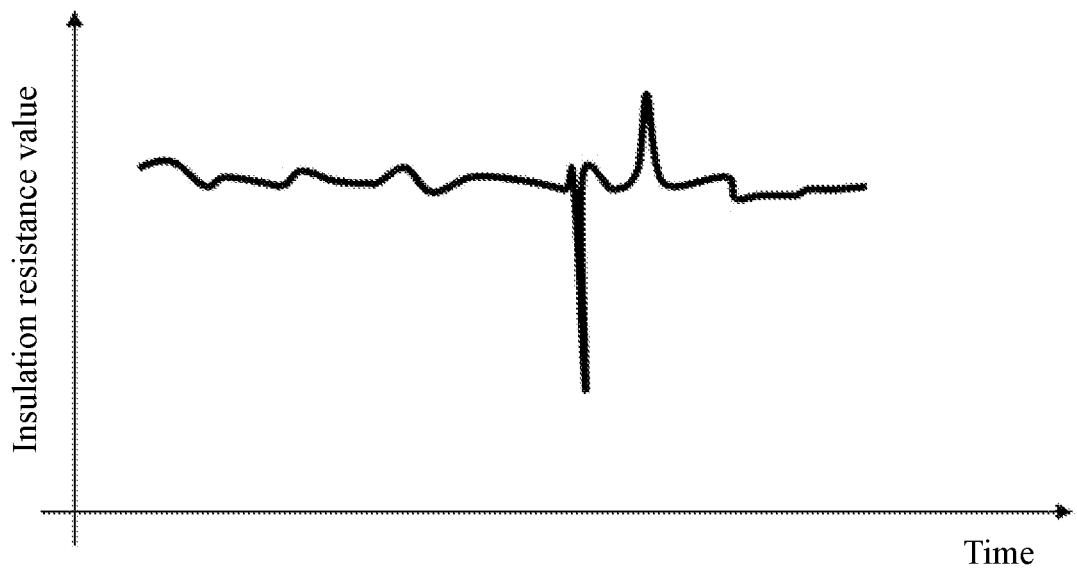
FIG. 2 is a schematic diagram of a change curve of insulation resistance values obtained when no insulation deterioration occurs on a traction battery according to an embodiment of the disclosure.

Step S103: Analyze, based on a data statistical result, whether the traction battery has a risk of insulation deterioration. Specifically, if it is determined, by analysis, that the traction battery has the risk of insulation deterioration, step S104 is performed; or if it is determined, by analysis, that the traction battery does not have the risk of insulation deterioration (for example, the traction battery is in a state of changes in the insulation resistance value as shown in FIG. 2), step S106 is performed.

Specifically, after the mean value res_avg, the variance res_std, and the percentile res_Npct of n insulation resistance values {res1, res2, ..., resi, ..., resn} within the first preset time period before the current moment are obtained by collecting data statistics on the insulation resistance values during this time period, if $$\begin{cases} \text{res\_avg} < \text{res\_avg\_set} \\ \text{res\_Npct} < \text{res\_avg\_set}, \\ \text{res\_std} < \text{res\_std\_set} \end{cases}$$

it is determined that the traction battery has the risk of insulation deterioration.

res_avg_set represents a preset value for the mean value of the insulation resistance values, and res_std_set represents a preset value for the variance of the insulation resistance values. As an example, when a voltage range of a high-voltage system of the electric vehicle is 300 V to 500 V, the value range of res_avg_set is 500 Ohm to 30000 Ohm, and a value range of res_std_set is 500 Ohm to 10000 Ohm.

In the embodiments of the disclosure, data quantification information (the mean value, the variance, and the percentile) that can represent the state of changes in the insulation resistance value during this time period is obtained by collecting data statistics on a large amount of insulation resistance values within a long period of time. Then, the data quantification information is used to be compared with the threshold, and whether the traction battery has the risk of insulation deterioration is determined based on a comparison result. Compared with the method of "comparing a single detected insulation resistance value with the resistance threshold directly and determining, based on a comparison result, whether the traction battery has insulation deterioration (if the insulation resistance value is less than the resistance threshold, it is determined that the traction battery has insulation deterioration)", in the disclosure, a problem of false determination of insulation deterioration of the traction battery caused by a large fluctuation of the insulation resistance value during a normal charging and discharging process of the traction battery and a problem that a reliable warning about insulation deterioration cannot be provided before the battery failure when a set value of the resistance threshold is low can be resolved. Specifically, because there is a larger fluctuation in the insulation resistance value during the normal charging and discharging process of the traction battery, when it is detected that the insulation resistance value is less than the resistance threshold, the insulation resistance value may be a normal fluctuation value of the insulation resistance, and the traction battery actually does not have the insulation deterioration. However, because the insulation resistance value is less than the resistance threshold, it may be determined by mistake that the traction battery has the insulation deterioration; and further, when the set value of the resistance threshold is low, if it is detected that the insulation resistance value is less than the resistance threshold, battery failures such as thermal runaway probably have occurred on the traction battery due to insulation deterioration. Therefore, this method cannot provide a reliable warning about insulation deterioration before the battery failure.

In this solution, first, a relatively high threshold condition is set, and a value range of res_avg_set is between 500 and 30000, such that some battery data with good insulation but large fluctuations during use enter a data pool suspected to be problematic. Therefore, it is necessary to make a further determination in a second stage to clarify the risk level of insulation deterioration, and to locate the faulty battery.

In an implementation, after it is determined, by analysis, that the traction battery is in a state of low insulation resistance value, there may be a step of analyzing the risk level of insulation deterioration of the traction battery. This step specifically includes:

Step S1031: Obtain, by taking the current moment as the starting time, each insulation resistance value of the traction battery that is received within a second preset time period before the current moment, and arrange the insulation resistance values in chronological order of reception to obtain an insulation resistance value array {resA1, resA2, ..., resAj, ..., resAm}. resAj represents the $j^{th}$ insulation resistance value in the insulation resistance value array, namely, the $j^{th}$ insulation resistance value received within the second preset time period before the current moment.

The "current moment" in this implementation is a same moment as the "current moment" in step S101. The second preset time period is much greater than the first preset time period in step S101, and a quantity of the insulation resistance values received within the second preset time period is also much greater than a quantity of the insulation resistance values received within the first preset time period (m>>n).

Step S1032: Perform a regression fitting calculation on the insulation resistance values in the insulation resistance value array, to obtain an insulation resistance fitting value corresponding to each insulation resistance value in the insulation resistance value array, and arrange, in the chronological order of reception in step S1032, the insulation resistance fitting values respectively corresponding to all the insulation resistance values, to obtain an insulation resistance fitting value array {resA_1, resA_2, ..., resA_j, ..., resA_m}. resA_j represents an insulation resistance fitting value corresponding to the $j^{th}$ insulation resistance value in the insulation resistance fitting value array, namely, an insulation resistance fitting value corresponding to the $j^{th}$ insulation resistance value that is received within the second preset time period before the current moment.

In this implementation, regression algorithms such as a tree regression (Tree Regression) algorithm, a ridge regression (Ridge Regression or Tikhonov Regularization) algorithm, a linear regression (Linear Regression) algorithm, and the like may be used to perform a regression fitting calculation on each insulation resistance value received within the second preset time period before the current moment.

Step S1033: Perform a first-order difference calculation on the insulation resistance fitting values in the insulation resistance fitting value array to obtain a first-order difference {resA_diff_1, resA_diff_2, ..., resA_diff_j, ..., resA_diff_m} corresponding to each insulation resistance fitting value. resA_diff_j represents a first-order difference corresponding to the $j^{th}$ insulation resistance fitting value in the insulation resistance fitting value array.

Step S1034: Compare each first-order difference with a preset difference threshold, analyze a risk level of insulation deterioration of the traction battery based on a comparison result, and output corresponding second alarm information.

In the embodiments of the disclosure, a regression fitting calculation is performed on a large amount of insulation resistance values obtained within a long period of time, and a regression fitting calculation result may be used to represent a change trend of the insulation resistance. Therefore, the risk level of insulation deterioration of the traction battery may be accurately evaluated by performing a first-order difference calculation on the regression fitting calculation result and comparing each first-order difference with the preset difference threshold.

In an implementation, the risk level of insulation deterioration of the traction battery may be determined by analysis according to the following steps:

First, count a first quantity count_down of first-order differences whose difference values are less than a preset lower difference value limit and a second quantity count_up of first-order differences whose difference values are greater than a preset upper difference value limit.

Figure 3:
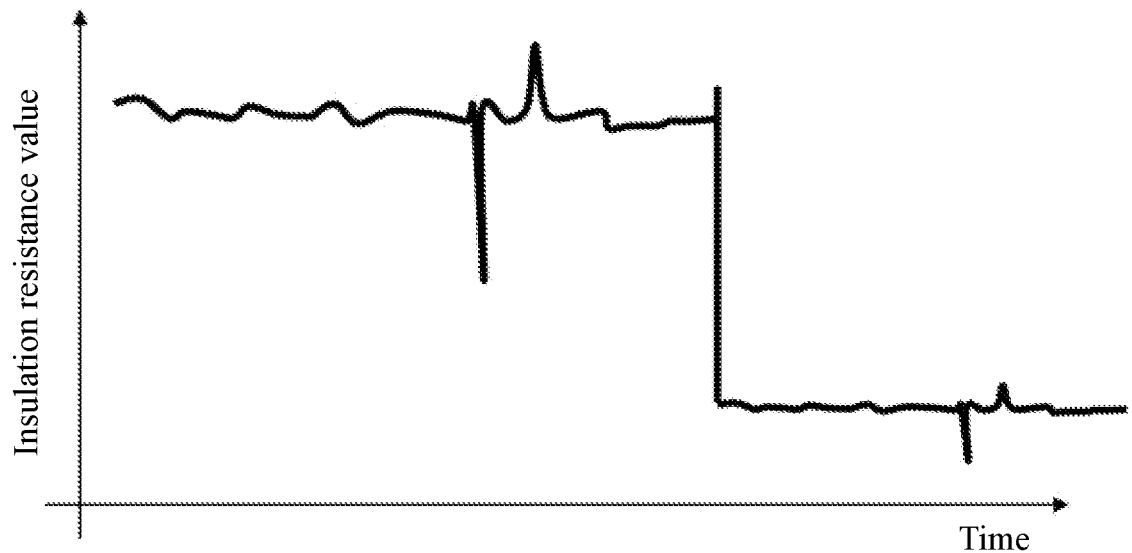
FIG. 3 is a schematic diagram of a change curve of insulation resistance values obtained when a risk level of insulation deterioration of a traction battery is a high risk level according to an embodiment of the disclosure.

Then, determine, by analysis based on the first quantity count_down and the second quantity count_up, the risk level of insulation deterioration of the traction battery. Specifically:

if count_down<2 and count_up=0, the risk level of insulation deterioration of the traction battery is a high risk level. count_up=0 indicates that there is no large difference between two adjacent insulation resistance values in the insulation resistance values (the insulation resistance value array) received within the second preset time period before the current moment (there is no large fluctuation in the change trend of the insulation resistance values), and count_down<2 indicates that there are rare cases in which two adjacent insulation resistance values approach each other (there is no relatively stable stage in the change trend of the insulation resistance values). Therefore, it may be concluded that the insulation resistance values of the traction battery during this time period are low and present a small fluctuation (shown by a change process of the low insulation resistance values on the right side of FIG. 3). In addition, in this implementation, the second alarm information indicating that the risk level of insulation deterioration of the traction battery is relatively high may further be output.

Figure 4:
FIG. 4 is a schematic diagram of a change curve of insulation resistance values obtained when a risk level of insulation deterioration of a traction battery is a medium risk level according to an embodiment of the disclosure.

If count_down>2 and count_up=0, the risk level of insulation deterioration of the traction battery is a medium risk level. count_down>2 indicates that there are many cases in which two adjacent insulation resistance values approach each other, and it is known that the traction battery is in a state of low insulation resistance value. Therefore, during this time period, the insulation resistance value of the traction battery is mainly in a gradually decreasing state (shown by a change process of the insulation resistance values in FIG. 4) rather than a gradually increasing state. In addition, in this implementation, the second alarm information indicating that the risk level of insulation deterioration of the traction battery is the medium risk level may further be output.

Figure 5:
FIG. 5 is a schematic diagram of a change curve of insulation resistance values obtained when a risk level of insulation deterioration of a traction battery is a low risk level according to an embodiment of the disclosure.

If count_down=2 and count_up=0 and resA_std=0, the risk level of insulation deterioration of the traction battery is a low risk level. resA_std is an insulation resistance fitting value variance obtained by performing a variance calculation on the insulation resistance fitting values corresponding to all the insulation resistance values received within the second preset time period before the current moment. resA_std=0 indicates that all the insulation resistance fitting values are the same (as shown on the right side of FIG. 5, the insulation resistance values remain unchanged). In addition, in this implementation, the second alarm information indicating that the risk level of insulation deterioration of the traction battery is the low risk level may further be output.

In the embodiments of the disclosure, the first quantity count_down of first-order differences whose difference values are less than a preset lower difference value limit and the second quantity count_up of first-order differences whose difference values are greater than a preset upper difference value limit are counted, the fluctuation state of the insulation resistance values of the traction battery (or a development trend of the insulation resistance values) may be determined by analysis, and then the risk level of insulation deterioration of the traction battery may be further determined.

In an implementation, when it is determined, by analysis, that the risk level of insulation deterioration of the traction battery is the low risk level, it is possible that the insulation resistance value of the traction battery cannot be detected due to a failure in the insulation resistance detection apparatus such as the battery management system. Therefore, when it is determined, by analysis, that the risk level of insulation deterioration of the traction battery is the low risk level, prompt information about a detection failure of the insulation resistance value of the traction battery may be output to prompt a user or an electric vehicle service provider to repair the insulation resistance detection apparatus such as the battery management system in time.

Step S104: Output First Alarm Information.

The first alarm information refers to prompt information that the traction battery has a risk of insulation deterioration. As an example, the content of the first alarm information may be "The current traction battery has the risk of insulation deterioration, please repair it in time".

Step S106: Do not Output the Alarm Information.

It should be noted that although the steps are described in a specific order in the foregoing embodiments, those skilled in the art can understand that in order to achieve the effects of the disclosure, different steps are not necessarily performed in such an order, but may be performed simultaneously (in parallel) or in other orders, and these changes shall all fall within the scope of protection of the disclosure.

Figure 6:
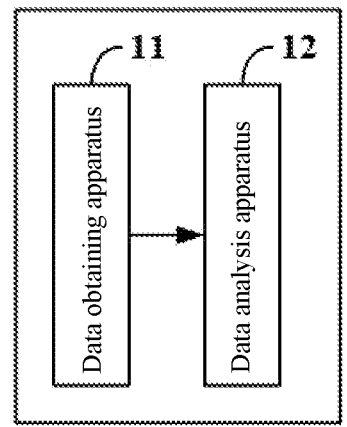
FIG. 6 is a schematic diagram of a main structure of an insulation monitoring system for a traction battery according to an embodiment of the disclosure.

Referring to FIG. 6, FIG. 6 is a schematic diagram of a main structure of an insulation monitoring system for a traction battery according to an embodiment of the disclosure. As shown in FIG. 6, in the embodiments of the disclosure, the insulation monitoring system for a traction battery mainly includes a data obtaining apparatus 11 and a data analysis apparatus 12. For simplicity, although the processor and the memory are not shown in FIG. 6, those skilled in the art may understand that the insulation monitoring system for a traction battery may be part of the processor and/or the memory. For example, in some embodiments, one or more of the data obtaining apparatus 11 and the data analysis apparatus 12 may be part of the processor. In some embodiments, these apparatuses may respectively correspond to a part of electronic circuits in the processor that perform signal or data processing, and may also correspond to related program codes stored in a computer-readable medium (such as a memory). In some embodiments, the data obtaining apparatus 11 and the data analysis apparatus 12 may alternatively not be a part of the current processor, but a part of another processor different from the current processor. In some embodiments, one or more of the data obtaining apparatus 11 and the data analysis apparatus 12 may be combined into one apparatus.

Specifically, the data obtaining apparatus 11 may be configured to obtain, by taking a current moment as a starting time, each insulation resistance value of the traction battery that is received within a first preset time period before the current moment. In an implementation, for the detailed description of function implementation, reference may be made to the description of step S101.

The data analysis apparatus 12 may be configured to collect data statistics on the insulation resistance values obtained by the data obtaining apparatus 11, and analyze, based on a data statistical result, whether the traction battery has a risk of insulation deterioration; and if the traction battery has the risk of insulation deterioration, output first alarm information. The data analysis apparatus 12 includes a mean/variance calculation module, a percentile calculation module, and a data analysis module. The mean/variance calculation module may be configured to separately perform mean and variance calculations on the insulation resistance values received within the first preset time period, to obtain a mean insulation resistance value res_avg and an insulation resistance value variance res_std. The percentile calculation module may be configured to: arrange, in ascending order, the insulation resistance values received within the first preset time period, and calculate a cumulative percentage corresponding to each arranged insulation resistance value; and obtain an insulation resistance value res_Npct corresponding to a cumulative percentage whose percentage value is a preset value N. The data analysis module may be configured to analyze, based on res_avg, res_std, and res_Npct, whether the traction battery has the risk of insulation deterioration, specifically including the following case: if $$\begin{cases} \text{res\_avg} < \text{res\_avg\_set} \\ \text{res\_Npct} < \text{res\_avg\_set}, \\ \text{res\_std} < \text{res\_std\_set} \end{cases}$$

the traction battery has the risk of insulation deterioration, where res_avg_set is a preset value for the mean insulation resistance value, and res_std_set is a preset value for the insulation resistance value variance. In an implementation, for the detailed description of function implementation, reference may be made to the descriptions of steps S102 and S103.

In an implementation, the insulation monitoring system for a traction battery may further include a battery insulation deterioration risk level analysis apparatus, and the battery insulation deterioration risk level analysis apparatus may include a data obtaining module, a regression fitting calculation module, a first-order difference calculation module, and an insulation deterioration risk level analysis module.

Specifically, the data obtaining module may be configured to: obtain, by taking the current moment as the starting time, each insulation resistance value that is received within a second preset time period before the current moment, and arrange the insulation resistance values in chronological order of reception to obtain an insulation resistance value array. The regression fitting calculation module may be configured to: perform a regression fitting calculation on the insulation resistance values in the insulation resistance value array, to obtain an insulation resistance fitting value corresponding to each insulation resistance value in the insulation resistance value array, and arrange, in the chronological order of reception, the insulation resistance fitting values respectively corresponding to all the insulation resistance values, to obtain an insulation resistance fitting value array. The first-order difference calculation module may be configured to perform a first-order difference calculation on the insulation resistance fitting values in the insulation resistance fitting value array to obtain a first-order difference corresponding to each insulation resistance fitting value. The insulation deterioration risk level analysis module may be configured to: compare each first-order difference with a preset difference threshold, analyze a risk level of insulation deterioration of the traction battery based on a comparison result, and output corresponding second alarm information. The second preset time period is much greater than the first preset time period, and a quantity of the insulation resistance values received within the second preset time period is much greater than a quantity of the insulation resistance values received within the first preset time period. In an implementation, for detailed description of function implementation, reference may be made to the descriptions of steps S1031 to S1034.

In an implementation, the insulation deterioration risk level analysis module may be configured to perform the following operations:

counting a first quantity count_down of first-order differences whose difference values are less than a preset lower difference value limit and a second quantity count_up of first-order differences whose difference values are greater than a preset upper difference value limit, where if count_down<2 and count_up=0, the risk level of insulation deterioration of the traction battery is a high risk level; if count_down>2 and count_up=0, the risk level of insulation deterioration of the traction battery is a medium risk level; and if count_down=2 and resA_std=0, the risk level of insulation deterioration of the traction battery is a low risk level; and further, when the risk level of insulation deterioration of the traction battery is the low risk level, prompt information indicating that the battery management system has a detection failure in the insulation resistance value may further be output. resA_std is an insulation resistance fitting value variance obtained by performing a variance calculation on the insulation resistance fitting values corresponding to all the insulation resistance values received within the second preset time period. In an implementation, for the detailed description of function implementation, reference may be made to the description of step S103.

The foregoing insulation monitoring system for a traction battery is configured to implement the embodiment of the insulation monitoring method for a traction battery shown in FIG. 1. The technical principles of, technical problems solved by, and technical effects provided by the insulation monitoring system are similar to those of the insulation monitoring method, and those skilled in the art may clearly understand that, for ease and simplicity of the description, for a specific process and a related description of the insulation monitoring system for a traction battery, reference may be made to the description of the embodiments of the insulation monitoring method for a traction battery, and details are not described herein again.

Based on the foregoing method embodiment, the disclosure further provides an embodiment of a storage apparatus. In the embodiment of the storage apparatus, the storage apparatus stores a plurality of pieces of program codes, and the program codes are adapted to be loaded and run by a processor to perform the insulation monitoring method for a traction battery described in the foregoing method embodiment. For ease of description, only parts related to the embodiments of the disclosure are shown. For specific technical details that are not disclosed, reference may be made to the method part of the embodiments of the disclosure.

Based on the foregoing method embodiment, the disclosure further provides an embodiment of a control apparatus. In the embodiment of the control apparatus, the apparatus includes a processor and a storage apparatus, the storage apparatus stores a plurality of pieces of program codes, and the program codes are adapted to be loaded and run by the processor to perform the insulation monitoring method for a traction battery described in the foregoing method embodiment. For ease of description, only parts related to the embodiments of the disclosure are shown. For specific technical details that are not disclosed, reference may be made to the method part of the embodiments of the disclosure.

Those skilled in the art can understand that all or some of the procedures in the method of the foregoing embodiment of the disclosure may also be implemented by a computer program instructing relevant hardware. The computer program may be stored in a computer-readable storage medium, and when the computer program is executed by a processor, the steps of the foregoing method embodiments can be implemented. The computer program includes computer program code, which may be in a source code form, an object code form, an executable file form, some intermediate forms, and the like. The computer-readable medium may include: any entity or apparatus that can carry the computer program code, such as a medium, a USB flash drive, a removable hard disk, a magnetic disk, an optical disc, a computer memory, a read-only memory, a random access memory, an electrical carrier signal, a telecommunications signal, and a software distribution medium. It should be noted that the content included in the computer-readable medium may be appropriately added or deleted depending on requirements of the legislation and patent practice in a jurisdiction. For example, in some jurisdictions, according to the legislation and patent practice, the computer-readable medium does not include an electrical carrier signal and a telecommunications signal.

Further, it should be understood that, since the configuration of the modules is merely intended to illustrate functional units of a system of the disclosure, a physical device corresponding to these modules may be a processor itself, or part of software, part of hardware, or part of a combination of software and hardware in the processor. Therefore, the number of modules in the figure is merely illustrative.

Those skilled in the art can understand that the modules in the system may be adaptively split or combined. Such a split or combination of specific modules does not cause the technical solutions to depart from the principle of the disclosure. Therefore, technical solutions after any such split or combination shall all fall within the scope of protection of the disclosure.

In the embodiments of the disclosure, insulation resistance values received within a relatively long period of time (such as 10 hours) are extracted, data statistics on these insulation resistance values are collected, and whether the traction battery has the risk of insulation deterioration is determined by analysis based on a data statistical result; and if the traction battery has the risk of insulation deterioration, alarm information is output. As an example, a battery management system of an electric vehicle detects an insulation resistance value of a traction battery in real time, and sends detected insulation resistance values to a backend server connected to the electric vehicle via a network. The backend server receives and stores the insulation resistance value corresponding to each traction battery. After determining, by performing the foregoing operations, that the traction battery has the risk of insulation deterioration, the backend server outputs the alarm information to the electric vehicle to prompt a user of the electric vehicle that the traction battery has the risk of insulation deterioration. In the embodiments of the disclosure, data statistics on a large amount of insulation resistance values within a long period of time are collected, and whether the traction battery has the risk of insulation deterioration is determined by analysis based on the data statistical result. Therefore, insulation deterioration can be predicted before the insulation deterioration occurs on the traction battery. This allows the user to perform battery maintenance in time before the insulation deterioration occurs on the traction battery, so as to prevent traction battery failures.

Heretofore, the technical solutions of the disclosure have been described with reference to an implementation shown in the accompanying drawings. However, it would have been readily understood by those skilled in the art that the scope of protection of the disclosure is obviously not limited to these specific implementations. Those skilled in the art can make equivalent changes or substitutions to the related technical features without departing from the principle of the disclosure, and all the technical solutions with such changes or substitutions shall fall within the scope of protection of the disclosure.

What is claimed is:

1. An insulation monitoring method for a traction battery, the method is performed by a backend server, wherein the method comprises:
   obtaining, by taking a current moment as a starting time, each insulation resistance value of the traction battery that is received within a first preset time period before the current moment;
   wherein the traction battery is the traction battery of an electric vehicle, and the insulation resistance value is the insulation resistance value of the traction battery detected in real time by a battery management system in the electric vehicle;
   collecting data statistics on the obtained insulation resistance values, and analyzing, based on a data statistical result, whether the traction battery has a risk of insulation deterioration; and if the traction battery has the risk of insulation deterioration, outputting first alarm information to the electric vehicle;
   wherein before the step of "collecting data statistics on the obtained insulation resistance values", the method further comprises:
   step S1: determining whether a quantity of the obtained insulation resistance values reaches a preset quantity threshold; and if the quantity of the obtained insulation resistance values reaches the preset quantity threshold, performing the step of "collecting data statistics on the obtained insulation resistance values"; or if the quantity of the obtained insulation resistance values does not reach the preset quantity threshold, performing step S2; and
   step S2: extending the current first preset time period based on a preset extension time, re-obtaining, by taking the current moment as the starting time, insulation resistance values received within an extended first preset time period before the current moment, and then performing step S1.

2. The insulation monitoring method for a traction battery according to claim 1, wherein the step of "collecting data statistics on the obtained insulation resistance values, and analyzing, based on a data statistical result, whether the traction battery has a risk of insulation deterioration" specifically comprises:
   separately performing mean and variance calculations on the insulation resistance values received within the first preset time period, to obtain a mean insulation resistance value res_avg and an insulation resistance value variance res_std;
   arranging, in ascending order, the insulation resistance values received within the first preset time period, and calculating a cumulative percentage corresponding to each arranged insulation resistance value;
   obtaining an insulation resistance value res_Npct corresponding to a cumulative percentage whose percentage value is a preset value N; and
   analyzing, based on res_avg, res_std, and res_Npct, whether the traction battery has the risk of insulation deterioration, specifically comprising the following case:
   if $$\begin{cases} \text{res\_avg} < \text{res\_avg\_set} \\ \text{res\_Npct} < \text{res\_avg\_set}, \\ \text{res\_std} < \text{res\_std\_set} \end{cases}$$

the traction battery has the risk of insulation deterioration, wherein
   res_avg_set is a preset value for the mean insulation resistance value, and res_std_set is a preset value for the insulation resistance value variance.

3. The insulation monitoring method for a traction battery according to claim 2, wherein after determining, by analysis, that the traction battery has the risk of insulation deterioration, the method further comprises:
   obtaining, by taking the current moment as the starting time, each insulation resistance value of the traction battery that is received within a second preset time period before the current moment, and arranging the insulation resistance values in chronological order of reception to obtain an insulation resistance value array;
   performing a regression fitting calculation on the insulation resistance values in the insulation resistance value array, to obtain an insulation resistance fitting value corresponding to each insulation resistance value in the insulation resistance value array, and arranging, in the chronological order of reception, the insulation resistance fitting values respectively corresponding to all the insulation resistance values, to obtain an insulation resistance fitting value array;
   performing a first-order difference calculation on the insulation resistance fitting values in the insulation resistance fitting value array to obtain a first-order difference corresponding to each insulation resistance fitting value; and
   comparing each first-order difference with a preset difference threshold, analyzing a risk level of insulation deterioration of the traction battery based on a comparison result, and outputting corresponding second alarm information, wherein
   the second preset time period is much greater than the first preset time period, and a quantity of the insulation resistance values received within the second preset time period is much greater than a quantity of the insulation resistance values received within the first preset time period.

4. The insulation monitoring method for a traction battery according to claim 1, wherein after determining, by analysis, that the traction battery has the risk of insulation deterioration, the method further comprises:
   obtaining, by taking the current moment as the starting time, each insulation resistance value of the traction battery that is received within a second preset time period before the current moment, and arranging the insulation resistance values in chronological order of reception to obtain an insulation resistance value array;
   performing a regression fitting calculation on the insulation resistance values in the insulation resistance value array, to obtain an insulation resistance fitting value corresponding to each insulation resistance value in the insulation resistance value array, and arranging, in the chronological order of reception, the insulation resistance fitting values respectively corresponding to all the insulation resistance values, to obtain an insulation resistance fitting value array;

performing a first-order difference calculation on the insulation resistance fitting values in the insulation resistance fitting value array to obtain a first-order difference corresponding to each insulation resistance fitting value; and comparing each first-order difference with a preset difference threshold, analyzing a risk level of insulation deterioration of the traction battery based on a comparison result, and outputting corresponding second alarm information, wherein the second preset time period is much greater than the first preset time period, and a quantity of the insulation resistance values received within the second preset time period is much greater than a quantity of the insulation resistance values received within the first preset time period.

5. The insulation monitoring method for a traction battery according to claim 4, wherein the step of "comparing each first-order difference with a preset difference threshold, and analyzing a risk level of insulation deterioration of the traction battery based on a comparison result" specifically comprises:

counting a first quantity count_down of first-order differences whose difference values are less than a preset lower difference value limit and a second quantity count_up of first-order differences whose difference values are greater than a preset upper difference value limit, wherein if count_down<2 and count_up=0, the risk level of insulation deterioration of the traction battery is a high risk level;

if count_down>2 and count_up=0, the risk level of insulation deterioration of the traction battery is a medium risk level; and if count_down=2 and count_up=0 and resA_std=0, the risk level of insulation deterioration of the traction battery is a low risk level, wherein resA_std is an insulation resistance fitting value variance obtained by performing a variance calculation on the insulation resistance fitting values corresponding to all the insulation resistance values received within the second preset time period.

6. The insulation monitoring method for a traction battery according to claim 5, wherein the method further comprises:

when the risk level of insulation deterioration of the traction battery is the low risk level, outputting prompt information about a detection failure of the insulation resistance value of the traction battery.

7. A storage apparatus storing a plurality of pieces of program codes, wherein the program codes are adapted to be loaded and run by a processor to perform the insulation monitoring method for a traction battery according to claim 1.

8. The insulation monitoring method for a traction battery according to claim 1, wherein after determining, by analysis, that the traction battery has the risk of insulation deterioration, the method further comprises:

obtaining, by taking the current moment as the starting time, each insulation resistance value of the traction battery that is received within a second preset time period before the current moment, and arranging the insulation resistance values in chronological order of reception to obtain an insulation resistance value array;

performing a regression fitting calculation on the insulation resistance values in the insulation resistance value array, to obtain an insulation resistance fitting value corresponding to each insulation resistance value in the insulation resistance value array, and arranging, in the chronological order of reception, the insulation resistance fitting values respectively corresponding to all the insulation resistance values, to obtain an insulation resistance fitting value array;

performing a first-order difference calculation on the insulation resistance fitting values in the insulation resistance fitting value array to obtain a first-order difference corresponding to each insulation resistance fitting value; and comparing each first-order difference with a preset difference threshold, analyzing a risk level of insulation deterioration of the traction battery based on a comparison result, and outputting corresponding second alarm information, wherein the second preset time period is much greater than the first preset time period, and a quantity of the insulation resistance values received within the second preset time period is much greater than a quantity of the insulation resistance values received within the first preset time period.

9. An insulation monitoring system for a traction battery, wherein the system comprises:

a data obtaining apparatus configured to obtain, by taking a current moment as a starting time, each insulation resistance value of the traction battery that is received within a first preset time period before the current moment; wherein the traction battery is the traction battery of an electric vehicle, and the insulation resistance value is the insulation resistance value of the traction battery detected in real time by a battery management system in the electric vehicle; and a data analysis apparatus configured to: collect data statistics on the insulation resistance values obtained by the data obtaining apparatus, and analyze, based on a data statistical result, whether the traction battery has a risk of insulation deterioration; and if the traction battery has the risk of insulation deterioration, output first alarm information to the electric vehicle;

wherein the data analysis apparatus is further configured to perform the following operations:

step S1: determining whether a quantity of the obtained insulation resistance values reaches a preset quantity threshold; and if the quantity of the obtained insulation resistance values reaches the preset quantity threshold, performing the step of "collecting data statistics on the obtained insulation resistance values"; or if the quantity of the obtained insulation resistance values does not reach the preset quantity threshold, performing step S2; and step S2: extending the current first preset time period based on a preset extension time, re-obtaining, by taking the current moment as the starting time, insulation resistance values received within an extended first preset time period before the current moment, and then performing step S1.

10. The insulation monitoring system for a traction battery according to claim 9, wherein the data analysis apparatus comprises a mean/variance calculation module, a percentile calculation module, and a data analysis module;

the mean/variance calculation module is configured to separately perform mean and variance calculations on the insulation resistance values received within the first preset time period, to obtain a mean insulation resistance value res_avg and an insulation resistance value variance res_std;

the percentile calculation module is configured to: arrange, in ascending order, the insulation resistance values received within the first preset time period, and calculate a cumulative percentage corresponding to each arranged insulation resistance value; and obtain an insulation resistance value res_Npct corresponding to a cumulative percentage whose percentage value is a preset value N; and the data analysis module is configured to analyze, based on res_avg, res_std, and res_Npct, whether the traction battery has the risk of insulation deterioration, specifically comprising the following case: if $$\begin{cases} \text{res\_avg} < \text{res\_avg\_set} \\ \text{res\_Npct} < \text{res\_avg\_set}, \\ \text{res\_std} < \text{res\_std\_set} \end{cases}$$

the traction battery has the risk of insulation deterioration, wherein res_avg_set is a preset value for the mean insulation resistance value, and res_std_set is a preset value for the insulation resistance value variance.

11. The insulation monitoring system for a traction battery according to claim 9, wherein the system further comprises a battery insulation deterioration risk level analysis apparatus, and the battery insulation deterioration risk level analysis apparatus comprises a data obtaining module, a regression fitting calculation module, a first-order difference calculation module, and an insulation deterioration risk analysis module;

the data obtaining module is configured to obtain, by taking the current moment as the starting time, each insulation resistance value received within a second preset time period before the current moment, and arrange the insulation resistance values in chronological order of reception to obtain an insulation resistance value array;

the regression fitting calculation module is configured to: perform a regression fitting calculation on the insulation resistance values in the insulation resistance value array, to obtain an insulation resistance fitting value corresponding to each insulation resistance value in the insulation resistance value array, and arrange, in the chronological order of reception, the insulation resistance fitting values respectively corresponding to all the insulation resistance values, to obtain an insulation resistance fitting value array;

the first-order difference calculation module is configured to perform a first-order difference calculation on the insulation resistance fitting values in the insulation resistance fitting value array to obtain a first-order difference corresponding to each insulation resistance fitting value; and the insulation deterioration risk level analysis module is configured to: compare each first-order difference with a preset difference threshold, analyze a risk level of insulation deterioration of the traction battery based on a comparison result, and output corresponding second alarm information, wherein the second preset time period is much greater than the first preset time period, and a quantity of the insulation resistance values received within the second preset time period is much greater than a quantity of the insulation resistance values received within the first preset time period.

12. The insulation monitoring system for a traction battery according to claim 11, wherein the insulation deterioration risk level analysis module is further configured to perform the following operations:

counting a first quantity count_down of first-order differences whose difference values are less than a preset lower difference value limit and a second quantity count_up of first-order differences whose difference values are greater than a preset upper difference value limit, wherein if count_down<2 and count_up=0, the risk level of insulation deterioration of the traction battery is a high risk level;

if count_down>2 and count_up=0, the risk level of insulation deterioration of the traction battery is a medium risk level; and if count_down=2 and count_up=0 and resA_std=0, the risk level of insulation deterioration of the traction battery is a low risk level, wherein resA_std is an insulation resistance fitting value variance obtained by performing a variance calculation on the insulation resistance fitting values corresponding to all the insulation resistance values received within the second preset time period.

13. The insulation monitoring system for a traction battery according to claim 12, wherein the insulation deterioration risk level analysis module is further configured to perform the following operations:

when the risk level of insulation deterioration of the traction battery is the low risk level, outputting prompt information about a detection failure of the insulation resistance value of the traction battery.

* * * * *